United States Patent
Zhang et al.

(10) Patent No.: US 8,110,888 B2
(45) Date of Patent: Feb. 7, 2012

(54) EDGE TERMINATION FOR HIGH VOLTAGE SEMICONDUCTOR DEVICE

(75) Inventors: Jinshu Zhang, Bend, OR (US); Dumitru Sdrulla, Bend, OR (US); Dah Wen Tsang, Bend, OR (US)

(73) Assignee: Microsemi Corporation, Bend, OR (US)

( * ) Notice: Subject to any disclaimer, the term of this patent is extended or adjusted under 35 U.S.C. 154(b) by 591 days.

(21) Appl. No.: 12/206,954

(22) Filed: Sep. 9, 2008

(65) Prior Publication Data
US 2009/0072340 A1 Mar. 19, 2009

Related U.S. Application Data

(60) Provisional application No. 60/973,345, filed on Sep. 18, 2007.

(51) Int. Cl.
*H01L 23/58* (2006.01)
*H01L 21/765* (2006.01)

(52) U.S. Cl. ............... 257/488; 257/630; 257/E29.009; 438/454

(58) Field of Classification Search .............. 257/488, 257/630, E29.009; 438/454
See application file for complete search history.

(56) References Cited

U.S. PATENT DOCUMENTS

| | | | |
|---|---|---|---|
| 5,075,739 A * | 12/1991 | Davies | 257/170 |
| 5,345,101 A | 9/1994 | Tu | |
| 5,712,502 A | 1/1998 | Mitlehner et al. | |
| 5,804,868 A | 9/1998 | Kobayashi et al. | |
| 6,242,784 B1 | 6/2001 | Zeng et al. | |
| 6,274,904 B1 | 8/2001 | Tihanyi | |
| 6,780,714 B2 | 8/2004 | Gajda et al. | |
| 7,419,877 B2 * | 9/2008 | Ryu et al. | 438/268 |

FOREIGN PATENT DOCUMENTS

| | | |
|---|---|---|
| DE | 19839970 A1 | 3/2000 |
| DE | 1020055041322 A1 | 3/2007 |
| EP | 0588320 A2 | 3/1994 |
| EP | 1076363 A3 | 2/2001 |
| EP | 1076364 A3 | 7/2003 |

(Continued)

OTHER PUBLICATIONS

Trajkovic, T. ; Udrea, F.; Waind, P.R. & Amaratunga,G.A.J., "The effect of static and dynamic parasitic charge in the termination area of high voltage devices and possible solutions," IEEE, Catalog No. OOCH37094C, 2000, pp. 1-4.

(Continued)

*Primary Examiner* — Stephen W Smoot
(74) *Attorney, Agent, or Firm* — Marger Johnson & McCollom, P.C.

(57) ABSTRACT

High voltage semiconductor devices with high-voltage termination structures are constructed on lightly doped substrates. Lightly doped p-type substrates are particularly prone to depletion and inversion from positive charges, degrading the ability of associated termination structures to block high voltages. To improve the efficiency and stability of termination structures, second termination regions of the same dopant type as the substrate, more heavily doped than the substrate but more lightly doped than first termination regions, are positioned adjoining the first termination regions. The second termination regions raise the field threshold voltage where the surface is vulnerable and render the termination structure substantially insensitive to positive charges at the surface. The use of higher dopant concentration in the gap region without causing premature avalanche is facilitated by only creating second termination regions for regions lacking field plate protection.

17 Claims, 8 Drawing Sheets

FOREIGN PATENT DOCUMENTS

GB 2355110 A 4/2001
GB 2373094 A 9/2002

OTHER PUBLICATIONS

Yilmaz, Hamza, Optimization and Surface Charge Sensitivity of High Voltage Blocking Structures with Shallow Junctions, IEEE Transaction on Electron Devices, vol. 38, No. 7, Jul. 1991, pp. 1666-1675.

European Patent Office, Supplementary European Search Report, EP08832474.4-2203/2195846, Aug. 29, 2011, 8 pages.

* cited by examiner

EDGE TERMINATION FOR HIGH VOLTAGE SEMICONDUCTOR DEVICE

RELATED APPLICATION DATA

This application claims the benefit of provisional application U.S. Ser. No. 60/973,345, filed Sep. 18, 2007, herein incorporated by reference.

BACKGROUND OF THE INVENTION

1. Technical Field

The present invention relates to high-voltage semiconductor devices, and more particularly to improvements to termination structures associated with central active areas of high-voltage semiconductor devices.

2. Discussion of Related Art

In order to block high voltages, high voltage semiconductor devices are constructed on lightly doped semiconductor starting material. Due to the field effect, lightly doped p-type surfaces are particularly prone to depletion and inversion from positive charges abundantly present in dielectric films placed in contact with the surface to protect it from scratches or other mechanical damage. Regardless of the source of these positive charges, the field effect alters the effective spacing of the termination structure and degrades its ability to sustain voltage.

U.S. Pat. No. 5,345,101 describes guard ring termination structures for high voltage active devices. The structures have two regions of differing conductivity levels and depths but of the same conductivity type.

U.K. Patent Application No. GB2355110A and European Patent Application No. EP 1076363A3 describe edge portions of high voltage semiconductor device active areas with first regions of a first conductivity type, second and third regions of second and third conductivity types, and oxide layers.

T. TRAJKOVIC, F. UDREA, P. R. WAIND, & G. A. J. AMARATUNGA, THE EFFECT OF STATIC AND DYNAMIC PARASITIC CHARGE IN THE TERMINATION AREA OF HIGH VOLTAGE DEVICES AND POSSIBLE SOLUTIONS (2000) describes a termination structure having p+ floating rings with shallow, lightly doped p and n rings to either side of the p+ floating rings, and an oxide layer.

European Patent Application No. EP1076364A3 describes a voltage termination structure of a semiconductor device having a substrate of a first semiconductor type and having first and second regions of a second semiconductor type formed within the substrate region.

U.K. Patent Application No. GB2373094A describes a high voltage device surrounded by highly doped floating rings, the surface area between each pair of rings having an alternating pattern of lowly doped p and n type regions, and the device and rings being covered with a passivation layer.

SUMMARY OF THE INVENTION

An improved high voltage p-channel semiconductor device comprising a p-channel metal oxide semiconductor field effect channel region in a central active area and a high voltage termination structure at the periphery of the device is disclosed.

To improve the efficiency and stability of the termination structure, second termination regions having the same dopant type as the lightly-doped semiconductor starting material are added to the conventional guarding ring structure (i.e., the first termination region).

The second termination regions can be placed on both edges of the first termination regions, at one edge of the first termination regions, or contiguously on the surface. The second termination regions have a doping concentration higher than the substrate, but lower than the first termination regions. These added second termination regions raise the field threshold voltage where the surface is vulnerable and render the termination structure substantially insensitive to positive charges at the surface.

In one embodiment of the present invention, a semiconductor device is provided. The semiconductor device has a lightly-doped substrate of a first semiconductor type, a central active area formed in the substrate, and a high-voltage termination structure formed in the substrate surrounding the central active area.

The high-voltage termination structure has a plurality of first termination regions of a second semiconductor type extending to a first depth beneath an upper surface of the substrate. A span of the substrate separates each of the first termination regions.

The high-voltage termination structure also has a plurality of discrete field oxide regions, each substantially covering a span of the substrate. The field oxide regions are separated laterally by first gaps over the first termination regions.

In addition, the high-voltage termination structure has at least one second termination region of the first semiconductor type subjacent a span of the substrate. The second termination region underlies a portion of the field oxide regions furthest from the central active area, adjoins and forms a p-n junction with one of the first termination regions, is separated laterally from another first termination region by a second gap under a portion of the field oxide regions closest to the central active area, and extends to a second depth from the surface of the substrate less than the first depth.

Finally, the high-voltage termination structure has a plurality of field plates substantially covering a portion of the field oxide region above the second gap.

In this embodiment of the present invention, the substrate may be a p-type substrate, the first termination regions may be n-type, and the second termination region may be p-type. In addition, the dopant concentration of the second termination region may be higher than the dopant concentration of the substrate and lower than the dopant concentration of the first termination regions.

In another aspect of the present invention, a method of manufacturing an embodiment of the foregoing semiconductor device is provided.

The foregoing and other objects, features and advantages of the invention will become more readily apparent from the following detailed description of a preferred embodiment of the invention that proceeds with reference to the accompanying drawings.

DETAILED DESCRIPTION

Figure 1:
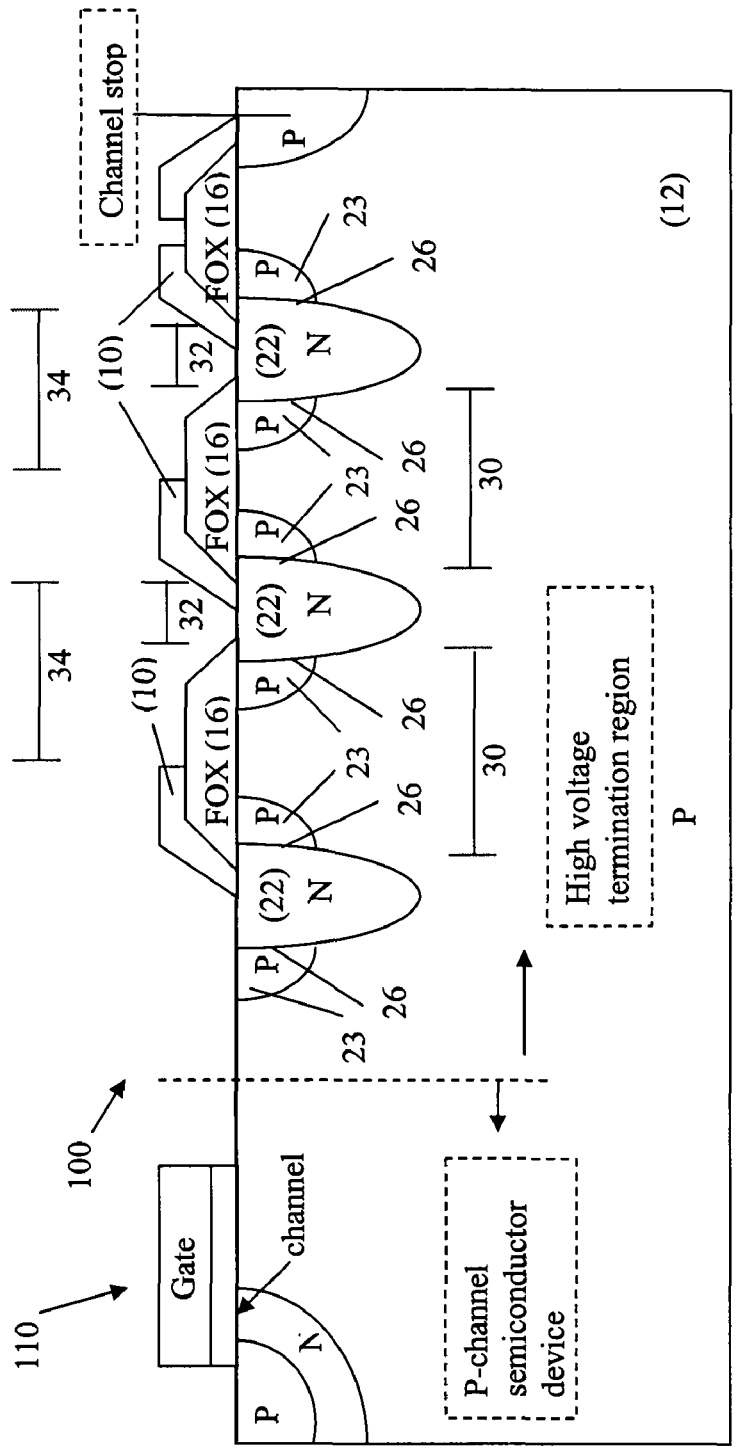
FIG. 1 is a cross-sectional view of a high-voltage termination structure having second termination regions on each side of a first termination region according to a first embodiment of the present invention.

FIG. 1 is a cross-sectional view of a high-voltage termination structure (100) surrounding a central active device area (110) and having second termination regions on each side of a first termination region according to a first embodiment of the present invention.

Referring to FIG. 1, a high voltage termination structure (100) is a ring-like structure which comprises a p-type substrate (12), n-type first termination regions (22), p-type second termination regions (23), field oxide rings (16) on the substrate surface spanning the gaps (30) between regions (23), and representative field plates (10), capacitively or resistively coupled to the first termination regions (22). At the extreme edge, the termination structure (100) has a field plate (10) and a channel stop region. In this first embodiment, p-type second termination regions are placed on both edges of the first termination regions adjoining and forming a PN junction along both sides of the first termination regions.

The total dopant charge added between adjacent first termination regions (22) should be light enough so it can be depleted without pinning the depletion region to cause premature avalanche, and yet sufficiently high to counteract the field effect from positive charges above the oxide-semiconductor interface. The second termination regions (23) need not be the same in doping concentration or in extent, although for ease of manufacturing, having the same doping provides convenience and lower cost. The second termination regions (23) have a depth from the substrate surface that is less than the depth of the first termination regions (22).

Figure 2:
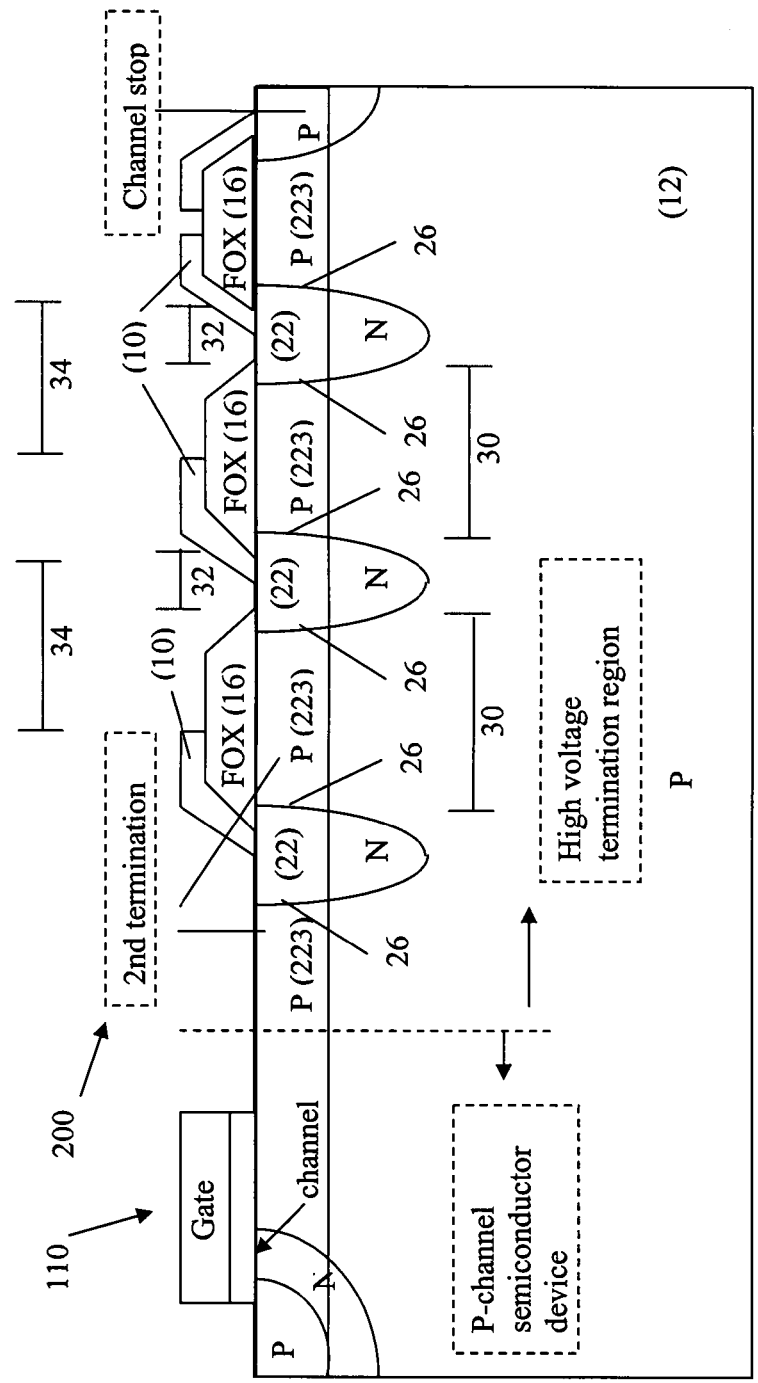
FIG. 2 is a cross-sectional view of a high-voltage termination structure having contiguous doping at the surface according to a second embodiment of the present invention.

FIG. 2 is a cross-sectional view of a high-voltage termination structure (200) having contiguous doping at the surface according to a second embodiment of the present invention. Features common to this embodiment and the first embodiment are labeled with like reference numerals.

Figure 3:
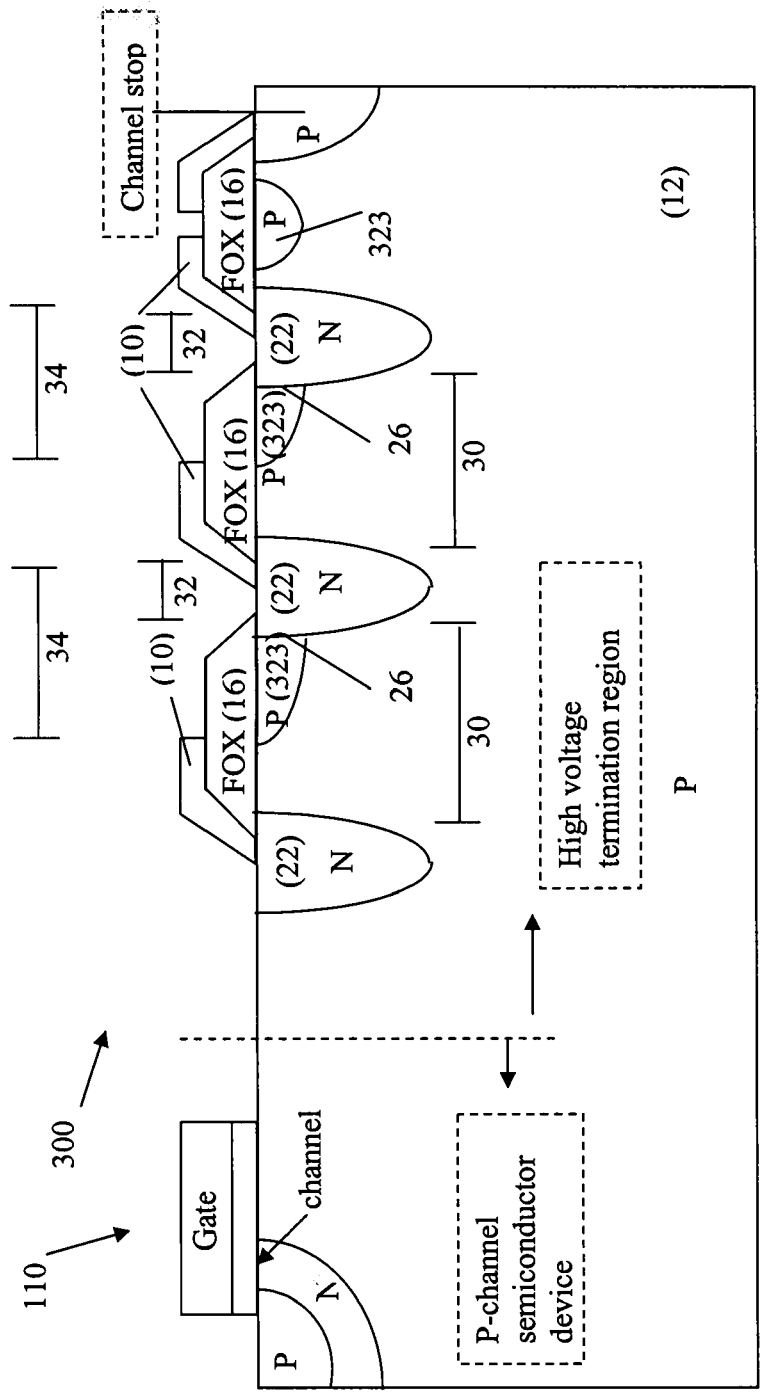
FIG. 3 is a cross-sectional view of a high-voltage termination structure having doping only in the gap region between the field plates according to a third embodiment of the present invention.

Referring to FIG. 2, the p-type second termination region (223) has a contiguous doping across the surface. We have found that for 500-600V, a dose from about $5.0E10$ cm$^{-2}$ to $5.0E11$ cm$^{-2}$ can be effective, and that for 1000-1400V, a dose from about $2.0E10$ cm$^{-2}$ to $1.0EL11$ cm$^{-2}$ can be effective. The dose is dependent on dimensions employed for the specific termination design. FIG. 3 is a cross-sectional view of a high-voltage termination structure (300) having doping only in the gap region between the field plates according to a third embodiment of the present invention. Features common to this embodiment and the first embodiment are labeled with like reference numerals.

Referring to FIG. 3, since the field plates (10) function as shields to charges located above them, the vulnerable locations in the termination structure (300) are the gaps (34) between the field plates (10). Only regions without field plate protection are doped for the construction of p-type second termination regions (323). This embodiment allows the use of higher doping concentration in the gap region without causing premature avalanche.

We have found that for 500-1200V devices, using a doping concentration for regions (323) within the field plate gaps (34) from about $4.0E11$ cm$^{-2}$ to $4E12$ cm$^{-2}$ can be effective, where lower dose goes with higher voltage.

Referring to FIGS. 1 through 3, a wide range of doping concentrations in the described example embodiments or combinations thereof have been shown to be effective in preventing lightly doped surface from degradation in the termination structure of a p-channel semiconductor device.

FIGS. 4A through 4E are cross-sectional views of different stages in the process of manufacturing a high-voltage termination structure (300) according to the third embodiment of the present invention.

Referring to FIGS. 4A-4F, the first steps relating to the creation of the high-voltage termination structure (300), which may substantially surround a central active area (110), begin with a silicon wafer comprising a lightly-doped substrate (12) of a first semiconductor type, shown in the drawings as p-type.

The wafer is covered with a first photoresist, which can be selectively exposed to light and etched away, leaving a first photoresist mask and exposing a first surface of the substrate (12) in the high voltage termination structure (300) region.

Figure 4A:
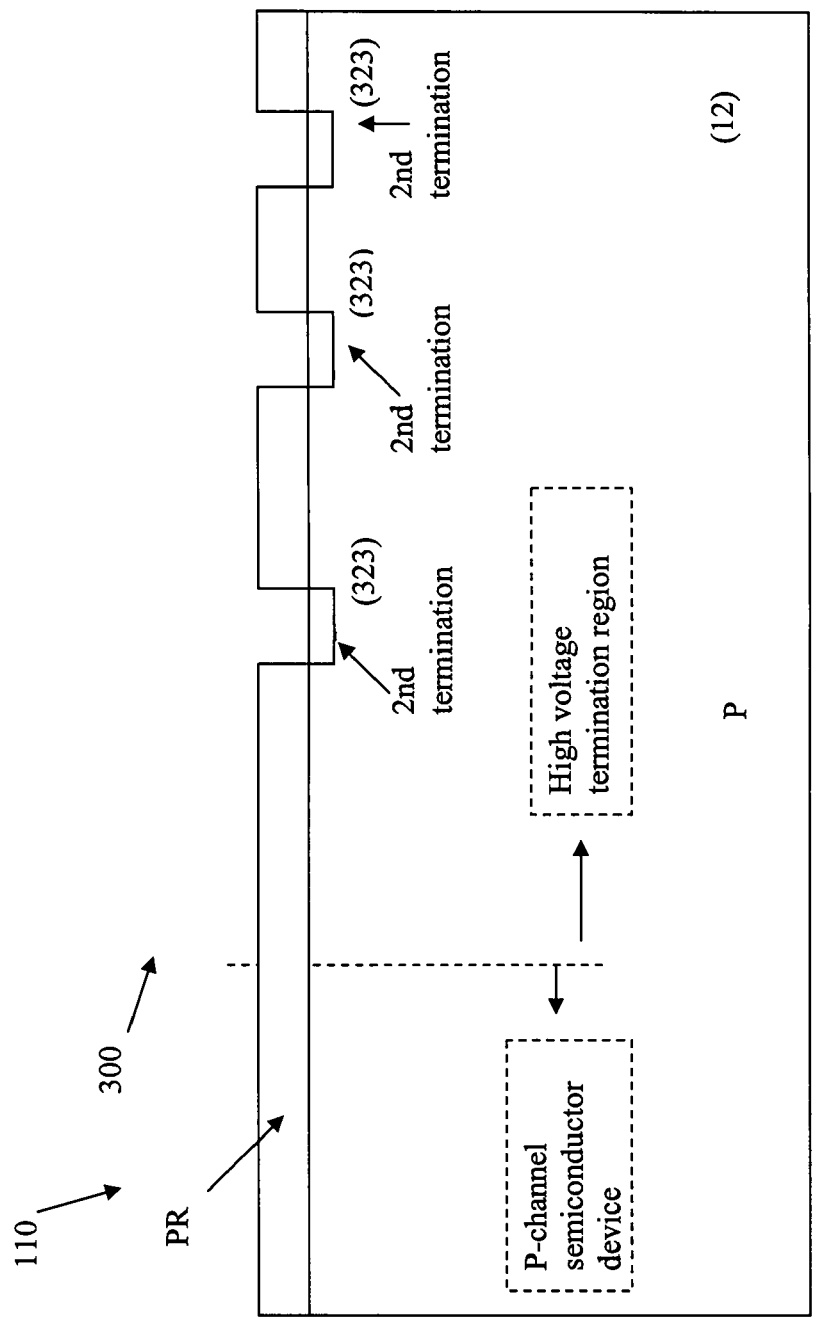
FIGS. 4A-4E are cross-sectional views of different stages in the process of manufacturing a high-voltage termination structure according to the third embodiment of the present invention.

Dopant may be implanted under the exposed first surface of the substrate (12), in the area of second termination regions (323), as shown in FIG. 4A. The implanted dopant may also be driven to form the second termination regions (323) of the first semiconductor type, p-type in this example.

The first photoresist mask then may be removed.

Figure 4B:
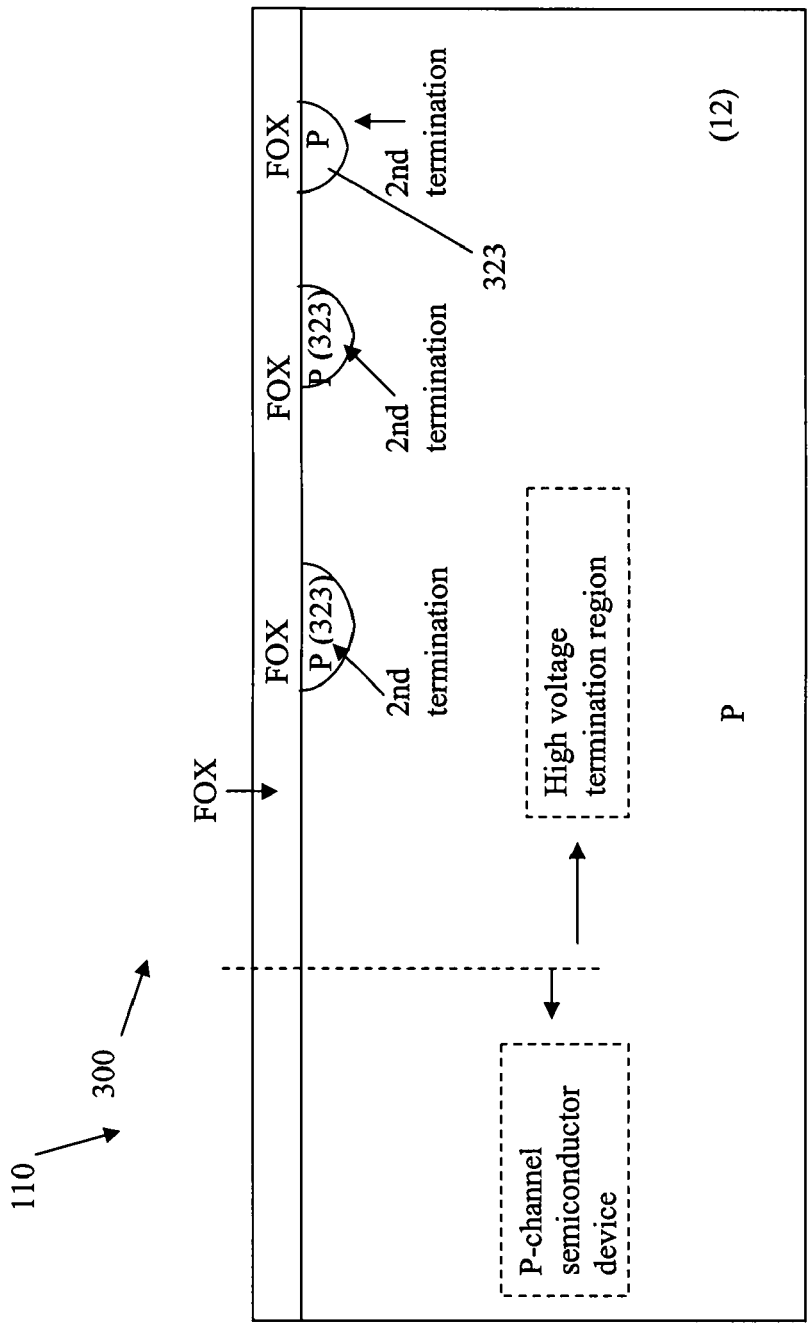

A first field oxide layer (FOX) substantially covering the substrate (12) is formed, as shown in FIG. 4B.

Referring to FIG. 4C, the wafer may again be covered with a second photoresist, which can be selectively exposed to light and etched away, leaving a second photoresist mask and exposing a first surface of the first field oxide layer in the high voltage termination structure (300) region.

Dopant may be implanted through the exposed first surface of the first field oxide layer into the substrate and may be driven to form first termination regions (22) of a second semiconductor type, n-type in the illustrated example. The first termination regions (22) of the second semiconductor type and the second termination regions (323) of the first semiconductor type adjoin each other and p-n junctions are formed between them. The second termination regions (323) may also be located on the sides of the first termination regions (22) closest to the central active area (110) region.

The exposed first surface of the first field oxide layer, along with the underlying field oxide, may be etched away, exposing an upper surface of the substrate (12) and leaving discrete field oxide regions (16) outside of the exposed surface of the substrate (12).

Figure 4C:
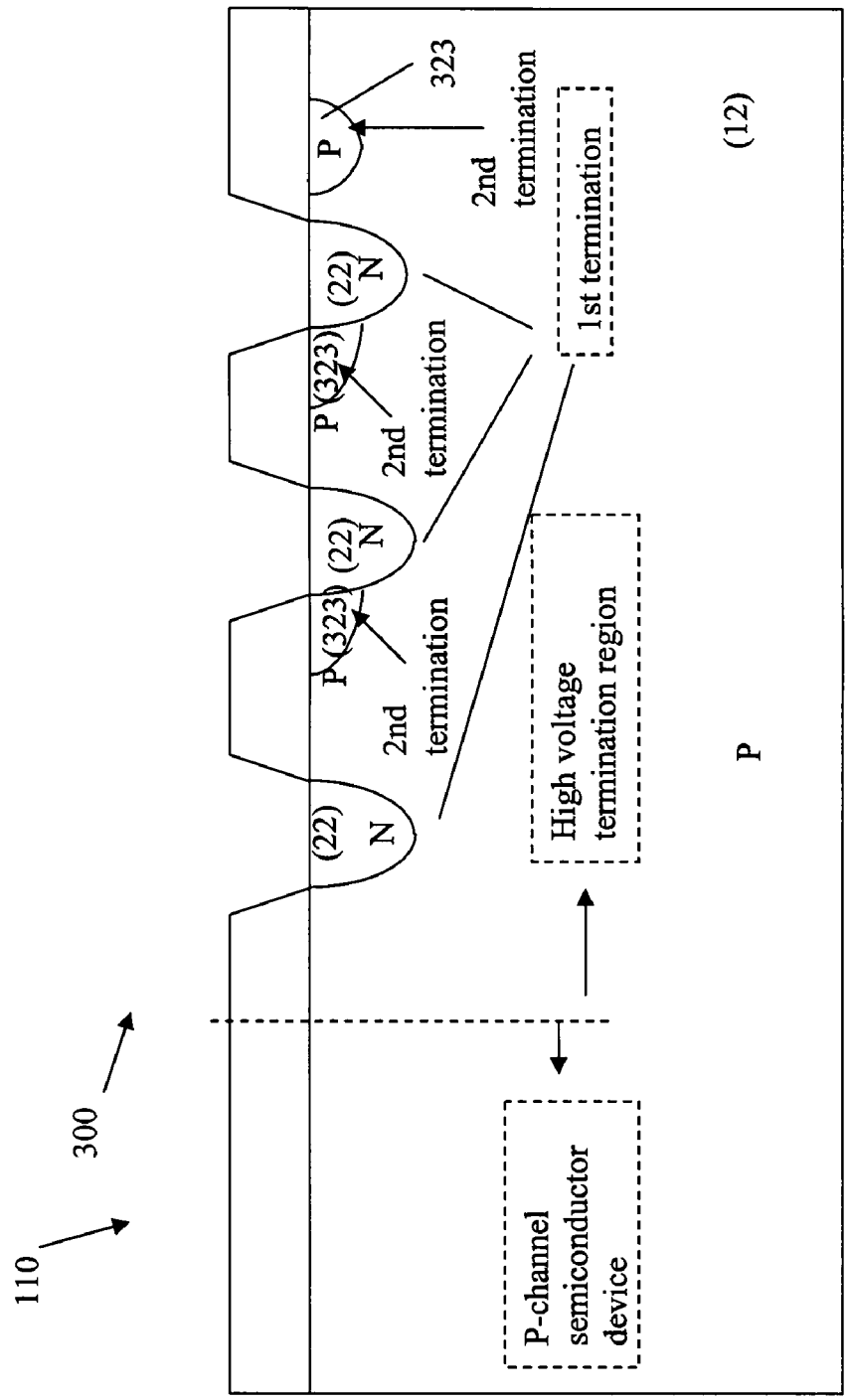

The second photoresist mask may then be removed, as shown in FIG. 4C.

The next steps relate to the creation of a central active area (110) associated with the high-voltage termination structure (300).

The wafer may again be covered with a third photoresist, which can be selectively exposed to light and etched away, leaving a third photoresist mask and exposing a second surface of the first field oxide layer, this time in the central active area (110) region. The exposed second surface of the first field oxide layer may extend to substantially all of the central active area (110) region.

The exposed second surface of the first field oxide layer, along with the underlying field oxide, may be etched away, exposing a third surface of the substrate (12) in the central active area.

A second field oxide layer may be formed on the exposed third surface of the substrate (12).

The third photoresist mask may then be removed.

A polysilicon layer may be formed on the second field oxide layer in the central active area (110) region through deposition. Dopant may be added to the polysilicon layer to serve as a gate conductor.

The wafer may again be covered with a fourth photoresist, which can be selectively exposed to light and etched away, leaving a fourth photoresist mask defining a gate region and exposing a first surface of the polysilicon layer in the central active area (110) region around the gate region.

The exposed first surface of the polysilicon layer, along with the underlying polysilicon, may be etched away, exposing a first surface of the second field oxide layer. Dopant may be implanted in the substrate (12) under the exposed first surface of the second field oxide layer, and the dopant may be subsequently driven to form a body of a second semiconductor type, n-type in this example.

The exposed first surface of the second field oxide layer, along with the underlying field oxide, may be etched away, exposing a fourth surface of the substrate (12) around the gate. Dopant may be implanted under the exposed fourth surface of the substrate (12) to form a source region with the body region—p-type in this example—, and the source dopant may be subsequently driven.

The fourth photoresist mask may then be removed.

Figure 4D:
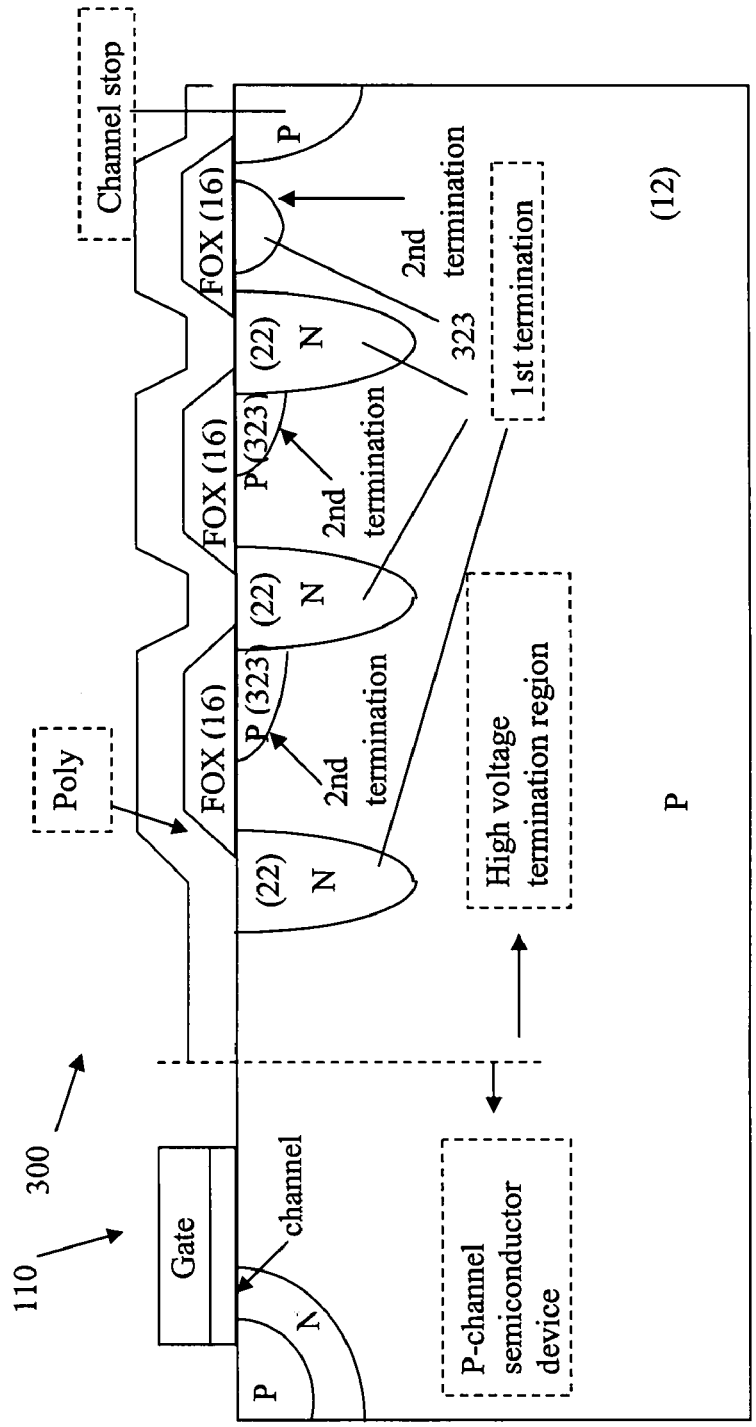

At this point, the creation of the central active area (110) is complete, as shown in FIG. 4D. The next set of steps relate to the high voltage termination structure (300).

During the creation of the central active area (110), or at a different time, a polysilicon layer may be formed and may be doped in the high voltage termination structure (300) region. For example, the polysilicon layer (Poly) formed and doped during creation of the central active area (110) may extend over both the central active area (110) region and the high-voltage termination structure (300) region of the silicon wafer. The polysilicon layer in the high voltage termination structure (300) region covers and contacts the exposed second surface of the substrate (12) and the discrete field oxide regions (16) outside of the second surface of the substrate (12), as shown in FIG. 4D.

The wafer may again be covered with a fifth photoresist, which can be selectively exposed to light and etched away, leaving a fifth photoresist mask and exposing a second surface of the polysilicon layer in the high voltage termination structure (300) region.

The exposed second surface of the polysilicon layer, along with the underlying polysilicon, may be etched, leaving field plates (10). The field plates may cover and contact part of the discrete field oxide regions (16) nearest to the central active area (110) region. The field plates thus extend over the portions of the field oxide that contacts the lightly doped rings of silicon substrate surface between the adjacent first and second termination structures.

Figure 4E:
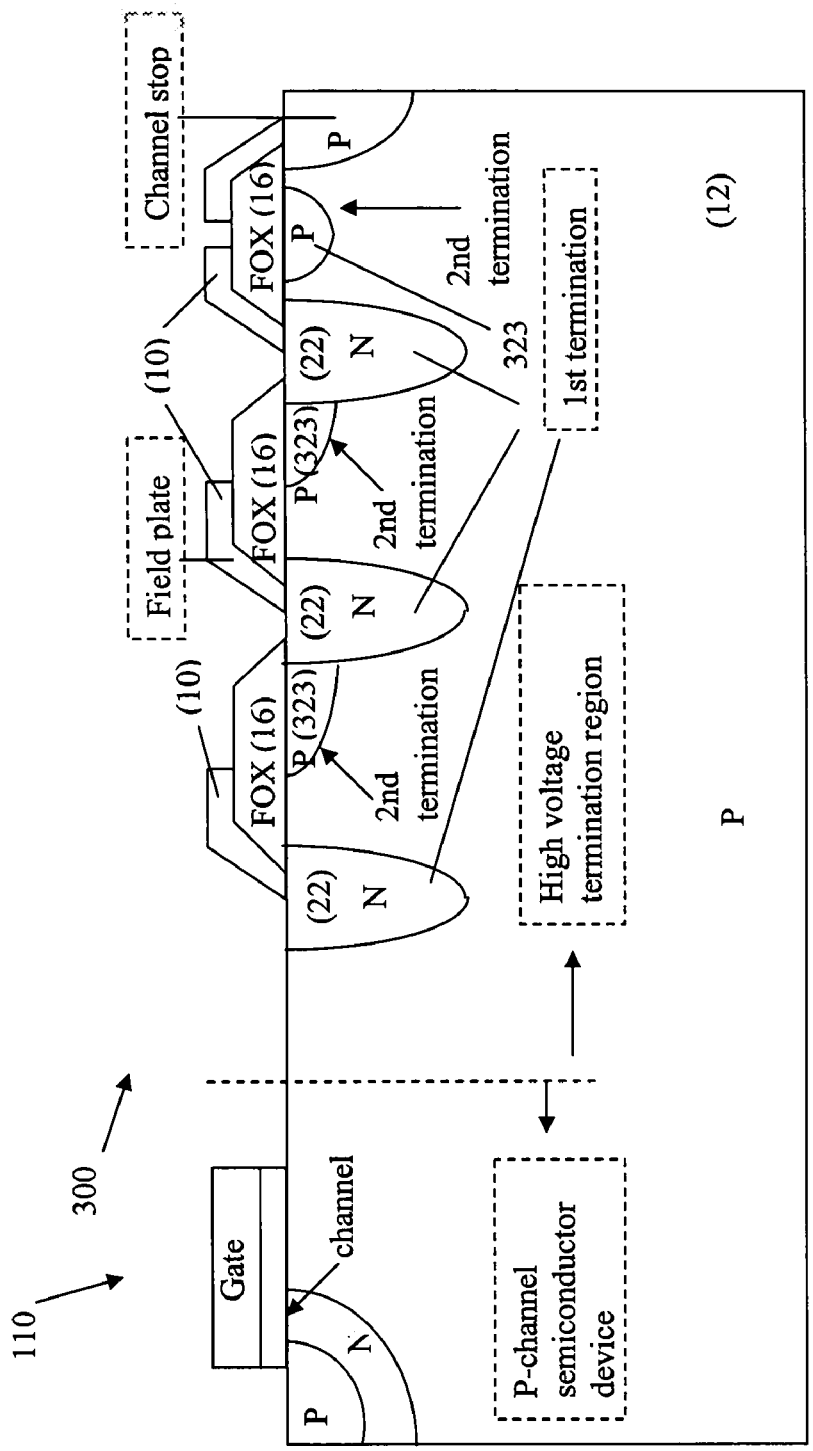

The fifth photoresist mask may then be removed, as shown in FIG. 4E.

At this point, the creation of the high voltage termination structure (300) is complete.

Having described and illustrated the principles of the invention in various embodiments thereof, it should be apparent that the invention can be modified in arrangement and detail without departing from such principles. We claim all modifications and variations coming within the spirit and scope of the following claims.

The invention claimed is:

1. A semiconductor device comprising a lightly-doped substrate of a first semiconductor type, a central active area formed in the substrate, and a high-voltage termination structure surrounding the central active area, wherein the high-voltage termination structure further comprises:
   a plurality of first termination regions of a second semiconductor type extending to a first depth beneath an upper surface of the substrate;
   a plurality of first spans of the substrate laterally separating the first termination regions;
   a plurality of discrete field oxide regions substantially covering the first spans of the substrate;
   a plurality of second spans of the substrate above the first termination regions laterally separating the discrete field oxide regions;
   at least one second termination region of the first semiconductor type subjacent each first span of the substrate, the second termination region adjoining and forming a p-n junction with one of the first termination regions on a side of the respective first termination region nearest to the central active region, extending to a second depth from the surface of the substrate less than the first depth; and
   a plurality of field plates, each field plate covering a portion of each respective field oxide region closest to the central active area, the field plates being laterally separated by gap regions of the substrate;
   each field plate having a first end overlying and capacitively or resistively coupled to the respective first termination region and a second end overlying a portion of the respective discrete field oxide region nearest to the central active area, so that the field plate and field plate ends are spaced laterally away from the p-n junction;
   the dopant concentration in the second termination regions being light enough to avoid premature avalanche in the depletion region and heavy enough to counteract the field effect from positive charges above the oxide-semiconductor interface.

2. A semiconductor device according to claim 1 wherein the dopant dose in the second termination regions ranges from about $4.0E11$ cm$^{-2}$ to about $4E12$ cm$^{-2}$.

3. A semiconductor device according to claim 1 wherein a plurality of second termination regions of the first semiconductor type adjoin and form a plurality of p-n junctions with both the first termination regions of the second semiconductor type underlying the portions of the field oxide regions furthest from the central active area and the first termination regions of the second semiconductor type underlying the portions of the field oxide regions closest to the central active area.

4. A semiconductor device according to claim 1 wherein the second termination region is contiguously doped at the surface of the substrate.

5. A semiconductor device according to claim 4 wherein the dopant dose in the second termination regions ranges from about $5.0E10$ cm$^{-2}$ to about $5.0E11$ cm$^{-2}$.

6. A semiconductor device according to claim 4 wherein the dopant dose in the second termination regions ranges from about $2.0E10$ cm$^{-2}$ to about $1.0E11$ cm$^{-2}$.

7. A semiconductor device according to claim 1, wherein the second termination region is selectively doped subjacent a first portion of the span of the substrate adjoining the side of the first termination region closest to the active device area and forming the p-n junction while leaving a second portion of the span of the substrate lightly doped.

8. A semiconductor device comprising a lightly-doped p-type substrate, a central active area formed in the substrate, and a high-voltage termination structure surrounding the central active area, wherein the high-voltage termination structure further comprises:
   a plurality of n-type first termination regions extending to a first depth beneath an upper surface of the substrate;
   a plurality of first spans of the substrate laterally separating the first termination regions;

a plurality of discrete field oxide regions substantially covering the first spans of the substrate;

a plurality of second spans of the substrate above the first termination regions separating the discrete field oxide regions;

at least one p-type second termination region subjacent each first span of the substrate, the second termination region adjoining and forming a p-n junction with one of the first termination regions on a side of the respective first termination region nearest to the central active region, extending to a second depth from the surface of the substrate less than the first depth, having a dopant concentration higher than the dopant concentration of the substrate and lower than the dopant concentration of first termination regions; and a plurality of field plates, each field plate covering a portion of each respective field oxide region closest to the central active area, the field plates being laterally separated by gap regions of the substrate;

each field plate having a first end overlying and capacitively or resistively coupled to the respective first termination region and a second end overlying a portion of the discrete field oxide region nearest to the central active area, so that the field plate and field plate ends are spaced laterally away from the p-n junction;

the dopant concentration in the second termination region being light enough to avoid premature avalanche in the depletion region and heavy enough to counteract the field effect from positive charges above the oxide-semiconductor interface.

9. A semiconductor device according to claim 8 wherein the p-type dopant dose in the second termination regions ranges from about $4.0E11\ cm^{-2}$ to about $4E12\ cm^{-2}$.

10. A semiconductor device according to claim 8 wherein a plurality of p-type second termination regions adjoin and form a plurality of p-n junctions with both the n-type first termination regions underlying the portions of the field oxide regions furthest from the central active area and the n-type first termination regions underlying the portions of the field oxide regions closest to the central active area.

11. A semiconductor device according to claim 8 wherein the second termination region is contiguously doped at the surface of the substrate.

12. A semiconductor device according to claim 8, wherein the second termination region is selectively doped subjacent a first portion of the span of the substrate adjoining the side of the first termination region closest to the active device area and forming the p-n junction while leaving a second portion of the span of the substrate lightly doped.

13. A method of fabricating a semiconductor device having a central active area and a high-voltage termination structure surrounding the central active area on a lightly-doped substrate of a first semiconductor type, the method comprising:

forming a plurality of first termination regions of a second semiconductor type extending to a first depth beneath an upper surface of the substrate and separated by a plurality of first spans of the substrate;

forming a plurality of discrete field oxide regions substantially covering the first spans of the substrate and separated laterally by second spans of the substrate above the first termination regions;

forming at least one second termination region of the first semiconductor type subjacent each span of the substrate, the second termination region adjoining and forming a p-n junction with one of the first termination regions on a side of the respective first termination region nearest to the central active region, extending to a second depth from the surface of the substrate less than the first depth; and forming a plurality of field plates, each covering a portion of each respective field oxide region closest to the central active area, the field plates being laterally separated by gap regions of the substrate;

each field plate having a first end overlying and capacitively or resistively coupled to the respective first termination region and a second end overlying a portion of the discrete field oxide region nearest to the central active area, so that the field plate and field plate ends are spaced laterally away from the p-n junction;

the dopant concentration in the second termination region being light enough to avoid premature avalanche in the depletion region and heavy enough to counteract the field effect from positive charges above the oxide-semiconductor interface.

14. A method of fabricating a semiconductor device according to claim 13 wherein the forming of the second termination regions of the first semiconductor type includes doping the second termination regions at a dopant dose from about $4.0E11\ cm^{-2}$ to about $4E12\ cm^{-2}$.

15. A method of fabricating a semiconductor device according to claim 13, wherein the second termination region is selectively doped subjacent a first portion of the span of the substrate adjoining the side of the first termination region closest to the active device area and forming the p-n junction while leaving a second portion of the span of the substrate lightly doped.

16. A method of fabricating a semiconductor device according to claim 13, wherein the second termination region is selectively doped subjacent a first portion of the span of the substrate adjoining the side of the first termination region closest to the active device area and forming the p-n junction while leaving a second portion of the span of the substrate lightly doped wherein the first semiconductor type is p-type.

17. A method of fabricating a semiconductor device according to claim 13, wherein the first semiconductor type is p-type and the second semiconductor type is n-type.

* * * * *